US006967350B2

(12) United States Patent
Frick et al.

(10) Patent No.: US 6,967,350 B2
(45) Date of Patent: Nov. 22, 2005

(54) MEMORY STRUCTURES

(75) Inventors: Peter J. Frick, Corvallis, OR (US); Andrew Koll, Albany, OR (US); James Stasiak, Lebanon, OR (US); Andrew L. Van Brocklin, Corvallis, OR (US); Lung T. Tran, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 234 days.

(21) Appl. No.: 10/116,497

(22) Filed: Apr. 2, 2002

(65) Prior Publication Data

US 2003/0185034 A1  Oct. 2, 2003

(51) Int. Cl.[7] .......................... H01L 29/00; H01L 27/10
(52) U.S. Cl. ..................... 257/50; 257/106; 257/202; 257/209; 257/211; 257/530
(58) Field of Search ................. 257/202, 209, 257/211, 50, 106, 530, 598

(56) References Cited

U.S. PATENT DOCUMENTS

| | | | |
|---|---|---|---|
| 3,271,591 A | 9/1966 | Ovshinsky | 307/88.5 |
| 3,530,441 A | 9/1970 | Ovshinsky | 340/173 |
| 3,641,516 A | 2/1972 | Castrucci et al. | 340/173 SP |
| 4,499,557 A | 2/1985 | Holmberg et al. | 365/163 |
| 4,599,705 A | 7/1986 | Holmberg et al. | 365/163 |
| 5,335,219 A | 8/1994 | Ovshinsky et al. | 369/288 |
| 5,349,220 A * | 9/1994 | Hong | 365/185.27 |
| 5,625,220 A | 4/1997 | Liu et al. | 257/530 |
| 5,659,500 A | 8/1997 | Mehrad | 365/185.05 |
| 5,751,012 A | 5/1998 | Wolstenholme et al. | 257/5 |
| 5,821,558 A | 10/1998 | Han et al. | 257/52 |
| 5,835,396 A | 11/1998 | Zhang | 365/51 |
| 5,942,777 A | 8/1999 | Chang | 257/296 |
| 6,002,607 A | 12/1999 | Dvir | 365/103 |
| 6,026,017 A | 2/2000 | Wong et al. | 365/185.05 |
| 6,033,955 A | 3/2000 | Kuo et al. | 438/257 |
| 6,034,882 A | 3/2000 | Johnson et al. | 365/103 |
| 6,111,302 A | 8/2000 | Zhang et al. | 257/530 |
| 6,185,121 B1 | 2/2001 | O'Neill | 365/94 |
| 6,185,122 B1 | 2/2001 | Johnson et al. | 365/103 |
| 6,351,406 B1 | 2/2002 | Johnson et al. | 365/103 |
| 6,534,841 B1 * | 3/2003 | Van Brocklin et al. | 257/530 |
| 6,559,516 B1 * | 5/2003 | Van Brocklin et al. | 257/530 |
| 6,608,776 B2 * | 8/2003 | Hidaka | 365/171 |
| 6,643,159 B2 * | 11/2003 | Fricke et al. | 365/51 |
| 6,677,220 B2 * | 1/2004 | Van Brocklin et al. | 438/467 |
| 6,711,045 B2 * | 3/2004 | Fricke et al. | 365/63 |
| 6,717,215 B2 * | 4/2004 | Fricke et al. | 257/347 |

(Continued)

OTHER PUBLICATIONS

Victor W.C. Chan et al., "Multiple Layers of CMOS Inegrated Circuits Using Recrystallized Silicon Film" IEEE Electron Device Letters, V. 22, No. 2 (Feb. 2001) pp. 77-79.

(Continued)

*Primary Examiner*—Mary Wilczewski
*Assistant Examiner*—Toniae M. Thomas

(57) ABSTRACT

A memory structure that includes a first electrode, a second electrode, a third electrode, a control element of a predetermined device type disposed between the first electrode and the second electrode, and a memory storage element of the predetermined device type disposed between the second electrode and the third electrode. The memory storage element has a cross-sectional area that is less than a cross-sectional area of the control element.

34 Claims, 8 Drawing Sheets

U.S. PATENT DOCUMENTS

| | | | |
|---|---|---|---|
| 6,744,086 B2 * | 6/2004 | Daughton et al. | 257/295 |
| 6,754,099 B2 * | 6/2004 | Hidaka | 365/173 |
| 6,771,473 B2 * | 8/2004 | Hiramoto et al. | 360/324.2 |
| 6,781,858 B2 * | 8/2004 | Fricke et al. | 365/51 |
| 6,831,861 B2 * | 12/2004 | Fricke et al. | 365/185.18 |
| 2001/0011776 A1 | 8/2001 | Igarashi et al. | 257/776 |
| 2001/0055838 A1 | 12/2001 | Walker et al. | 438/129 |
| 2003/0183867 A1 * | 10/2003 | Fricke et al. | 257/314 |
| 2003/0183868 A1 * | 10/2003 | Fricke et al. | 257/314 |
| 2003/0186468 A1 * | 10/2003 | Lazaroff et al. | 438/3 |
| 2004/0145008 A1 * | 7/2004 | Fricke et al. | 257/320 |

OTHER PUBLICATIONS

Thomas H. Lee, "A Vertical Leap for Microchips," Scientific American, Jan. 2002, pp. 53-59.

Esmat Hamdy et al., "Dielectric based antifuses for logic and memory ICs" IEEE International Electron Devices Meeting, IEDM 88 (Aug. 1988) pp. 786-789.

Chenming Hu, "Interconnect devices for field programmable gate array." IEEE International Electron Devices Meeting, IEDM 92 (Apr. 1992) pp. 591-594.

Jonathan Green et al., "Antifuse Field Programmable Gate Arrays" Proc. IEEE vol. 81 No. 7 (Jul. 1993), pp. 1042-1056.

Vivek D. Kulkami et al. "Patterning of Submicron Metal Features and Pillars in Multilevel Metallization" J. Electrochem. Soc. vol. 135 No. 12 (Dec. 1988) pp. 3094-3098.

* cited by examiner

MEMORY STRUCTURES

BACKGROUND OF THE DISCLOSURE

As computer and other electrical equipment continue to drop in price, the manufacturers of storage devices, such as memory devices and hard drives, are forced to lower the cost of their components. At the same time, computer, video game, television and other electrical device markets are requiring increasingly larger amounts of memory to store images, photographs, videos, movies, music and other storage intensive data. Thus, besides reducing cost, manufacturers of storage devices must also increase the storage density of their devices. This trend of increasing memory storage density while reducing cost required to create the storage has been on-going for many years, and even optical storage such as CD-ROM, CD-R, CD-R/W, DVD, and DVD-R variants are being challenged by device size limitations and cost. There is accordingly a need for economical, high capacity memory structures.

BRIEF DESCRIPTION OF THE DRAWINGS

The features and advantages of the disclosure will readily be appreciated by persons skilled in the art from the following detailed description when read in conjunction with the drawing wherein.

DETAILED DESCRIPTION OF THE DISCLOSURE

Figure 1:
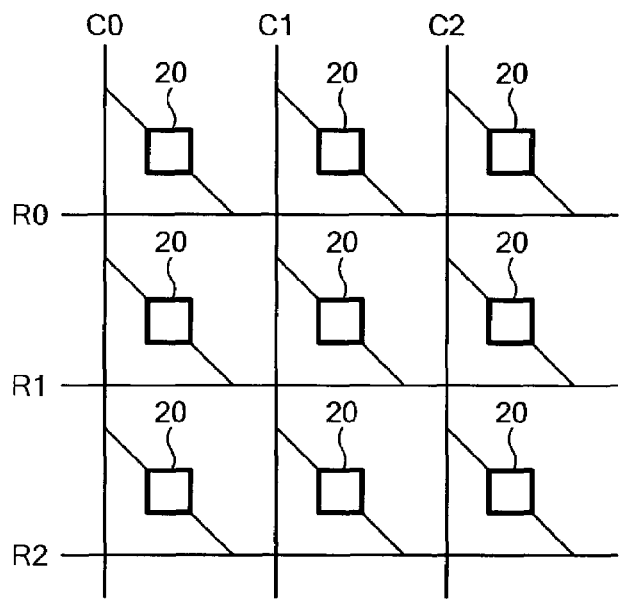
FIG. 1 is a schematic diagram of an embodiment of a cross-point memory array in which the disclosed memory cell structures can be utilized.

FIG. 1 is a simplified schematic diagram of an embodiment of a cross-point memory array 10 in which the disclosed memory cell structures can be utilized. The memory arrangement 10 includes row selection conductor lines R0, R1, R2 and column selection conductor lines C0, C1, C2. A memory cell 20 is connected between each row selection conductor line R0, R1, R2 and each column selection conductor line C0, C1, C2. It should be appreciated that the row selection conductor lines and the column selection conductor lines are referred to by "row" and "column" terminology for convenience, and that in actual implementations the memory cells 20 do not necessarily have to be physically arranged in rows and columns. Each memory cell is basically uniquely accessed or selected by a first selection line and a second selection line that can be oriented in different ways. Also, the column lines do not have to be orthogonal to the row lines, but are illustrated in that manner for ease of understanding.

Figure 2:
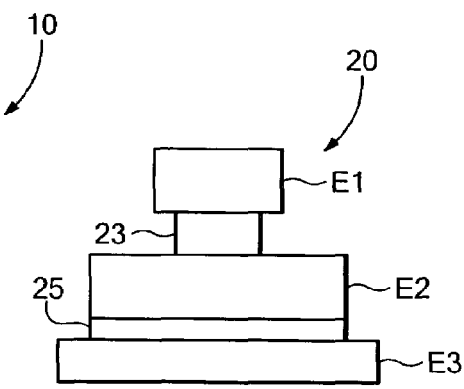
FIG. 2 is a schematic block diagram of an embodiment of a memory cell that includes a memory storage element and a control element for the memory storage element.

FIG. 2 is a simplified electrical block diagram of an embodiment of the memory cell 20 which includes a memory storage element 23 that is electrically connected to a control element 25 by an electrode E2. The memory storage element 23 and the control element 25 are serially connected between an electrode E1 and an electrode E3. The electrodes E1–E3 comprise conductive elements such as conductors, conductive regions or other conductive features, and it should be appreciated that the electrode E2 can comprise one or more electrically conductive elements.

The memory storage element 23 is configured as a change state memory storage element, while the control element 25 is configured as a control element for the change state memory storage element and provides current to the memory storage element. More particularly, the memory storage element is configured to predictably and reliably break down at a lower energy level than the control element, while the control tunnel junction region is configured for sustained operation as a control element for the memory.

Each of the memory storage element 23 and the control element 25 includes a cross-sectional area through which current flows. For example, such area can be defined by the overlap of the interfaces between the element and the electrodes on either side of the element. In the memory structures disclosed herein, the control element 25 and the memory element 23 can be of the same device type, and the control element 25 has a cross-sectional area that is greater than the cross-sectional area of the memory storage element, for example such that the memory storage element will break down at a lower energy level than the control element. In other words, the ratio between the control element cross-sectional area and the memory storage element cross-sectional area can be selected so that the memory storage element functions as a state change memory storage element, while the control element has control element cross-sectional area configured for sustained operation as a control element for the memory storage element. Thus, the memory storage element 23 changes state at a lower energy level than the control element 25, which allows the memory storage element to be programmed. In this manner, a memory cell is programmed by selectively providing sufficient energy to the cell to cause the memory storage element to break down. A memory cell is read by providing a lesser amount of energy to cell and sensing whether current flows through the cell.

By way of illustrative example, the ratio between the cross-sectional area of the control element and the cross-sectional area of the memory storage element can be in the range of about 2 to 20.

The memory storage element 23 can be an antifuse device, such as a programmable tunnel junction device. The antifuse device can be either a dielectric rupture type device or a tunnel junction device. The tunnel junction can be formed from oxidized metal, thermally grown oxide, or deposited oxides or nitrides. The memory storage element may also be embodied with semiconductor materials such as polysilicon, polycrystalline silicon, amorphous silicon, microcrystalline silicon, metal filament electro migration, trap induced hysterisis, ferroelectric capacitor, Hall effect, and polysilicon resistors. Other embodiments of the memory storage element include tunneling magneto-resistive or capacitive elements as floating gates. Still further, the memory storage element can be a read only LeComber or silicide switch or a re-writable phase-change material including a write-erase-write phase change material. The memory storage element can also comprise a PIN diode or a Schottky diode.

The control element 25 can comprise a tunnel junction device or PN, PIN or Schottky diodes. Other diodes that can be used include Zener diodes, avalanche diodes, tunnel diodes, and a four layer diode such as a silicon controlled rectifier. Also, the control element 25 can be a junction field effect or bipolar transistor. The control element 25 is sized sufficiently to carry an adequate current such that the state of the storage element 23 can be changed. When the control element is a diode, it can be formed using doped polysilicon, amorphous silicon, or microcrystalline silicon.

The memory storage element 23 and the control element can also be of the same device type, wherein both can comprise tunnel junction devices, Schottky diodes, or PIN diodes, for example.

For conciseness, the disclosed memory structures are described as employing tunnel junction devices as the memory storage elements and control elements, and it should be appreciated that the memory storage elements and control elements can be implemented as described previously.

By way of illustrative examples, the disclosed memory structures will be shown as integrated circuits that include interlayer dielectric such as silicon dioxide, silicon nitride, or TEOS (tetraethylorthosilicate) that provide support and isolation between various structures of an integrated circuit. The ILD can be deposited using several different technologies such as chemical vapor deposition (CVD), atmospheric pressure CVD, low pressure CVD, plasma enhanced CVD, physical vapor deposition (PVD), and sputtering. For convenience, regions and layers of such dielectric are identified in the drawings by the reference designation ILD.

Figure 3:
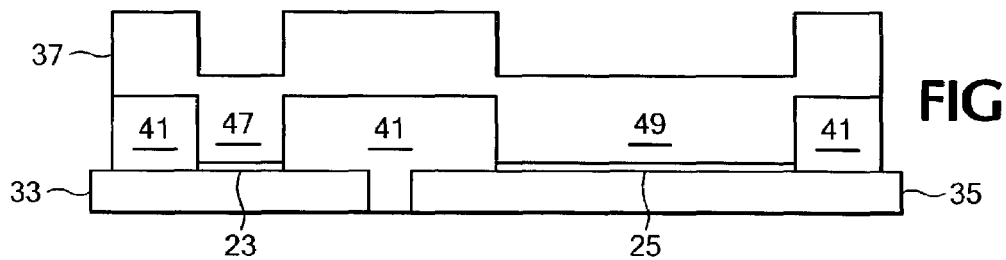
FIG. 3 is a sectional view and FIG. 4 is a plan view that schematically depict an embodiment of a memory structure that includes a memory storage element and a control element that has a cross-sectional area that is larger than a cross-sectional area of the memory storage element.
Figure 4:
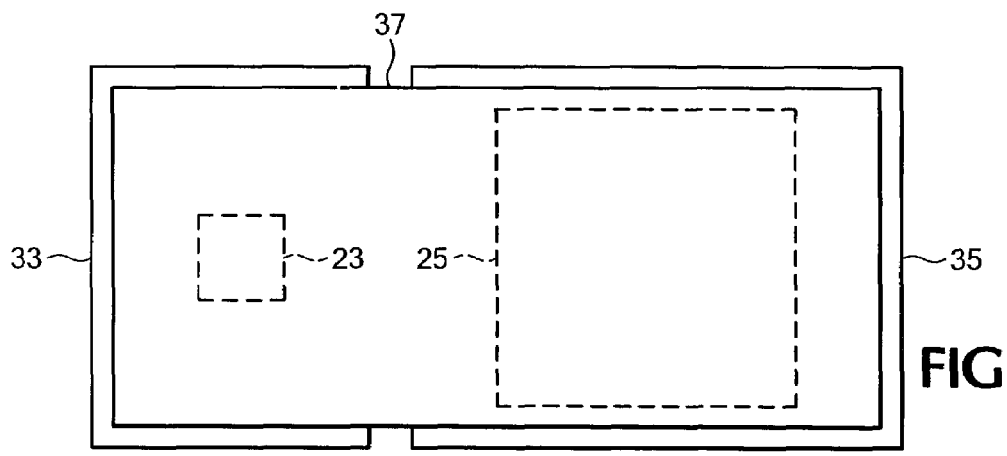

FIGS. 3 and 4 schematically depict an embodiment of a memory cell that includes a memory storage element 23 disposed on a first conductor 33. A control element 25 is disposed on a second conductor 35 that is laterally or transversely adjacent the first conductor 33. The memory storage element 23 and the control element 25 are thus horizontally, transversely or laterally separated and each can have a generally horizontal planar extent. The first and second conductors 33, 35 can be substantially coplanar, and the memory storage element 23 and the control element 25 can also be substantially co-planar. A dielectric layer 41 is disposed over the first and second conductors 33, 35 and includes openings 47, 49 over the memory storage element 23 and the control element 25. A conductive layer 37 is disposed on the dielectric layer 41 and extends into the openings 47, 49 so as to form an electrode between the memory storage element 23 and the control element 25.

The memory storage element 23 can be formed of an oxide of the first conductor 33, while the control element 25 can be formed of an oxide of the underlying second conductor 35. Alternatively, the memory storage element 23 can be formed of an oxide that is different from an oxide of the first conductor 33, and the control element 25 can be formed of an oxide that is different from an oxide of the second conductor 35. The memory storage element 23 can also be a portion of an unpatterned oxide layer that can be a deposited oxide layer or a completely oxidized deposited metal layer, for example. Similarly, the control element 25 can be a portion of an unpatterned oxide layer that can be a deposited oxide layer or a completely oxidized deposited metal layer, for example.

Figure 5:
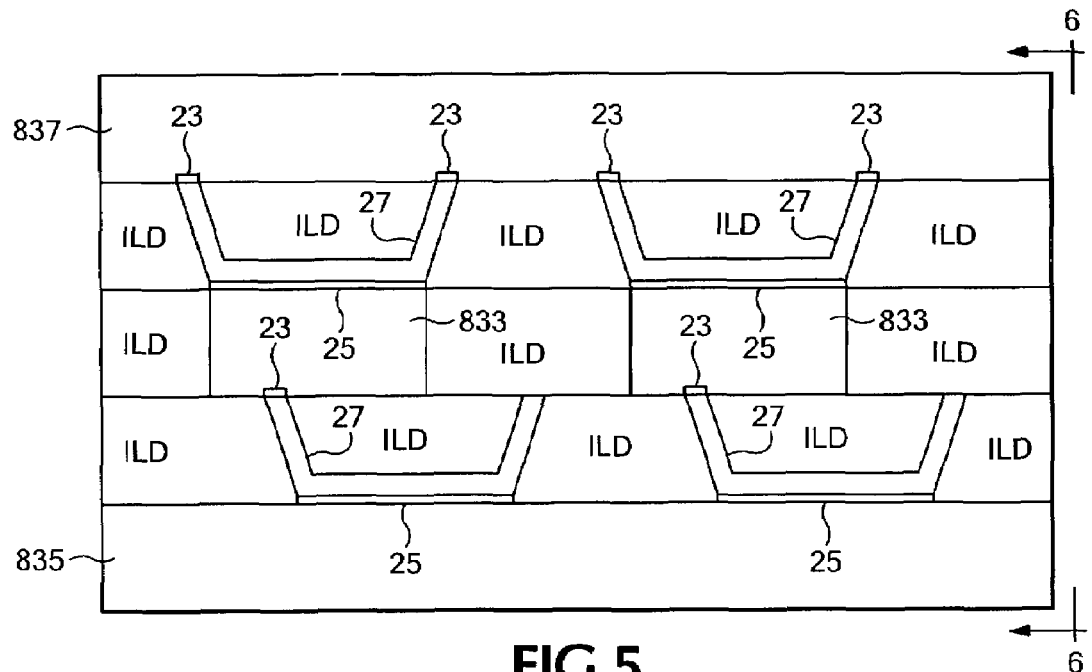
FIGS. 5 and 6 are sectional views that schematically depict another embodiment of a memory structure that includes a memory storage element and a control element that has a cross-sectional area that is larger than a cross-sectional area of the memory storage element.
Figure 6:
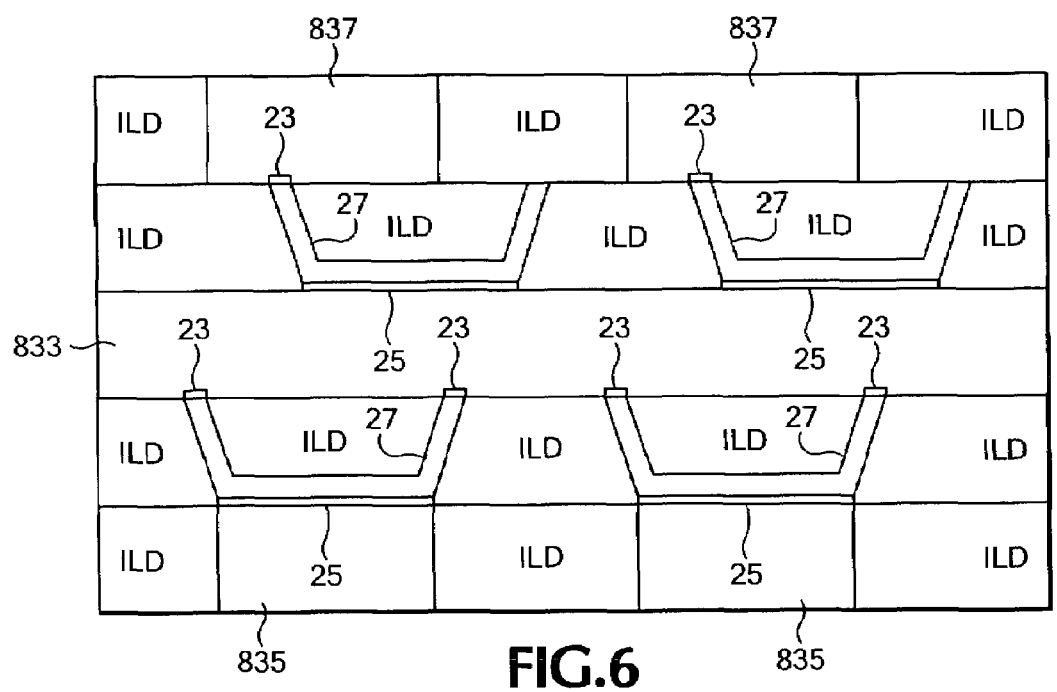

FIGS. 5 and 6 schematically depict an embodiment of a memory structure that includes a plurality of memory cells each including a memory storage element 23 disposed between the rim edge of a conductive well or tub 27 and a conductor 833 or 837 that is vertically adjacent the rim edge. Each memory cell further includes a control element 25 disposed between the base of the conductive tub 27 and a conductor 833 or 835 that is vertically adjacent the base. The memory storage element 23 and/or the control element 25 can have a horizontally planar extent, and are vertically separated.

The memory cells of FIGS. 5 and 6 can be implemented in stacked layers for example wherein a conductor 833 that is vertically adjacent the rim edge of a given conductive tub 27 is vertically adjacent the base of a conductive tub 27 that is in an adjacent layer.

By way of illustrative example, the conductor 833 can be a row selection line while the conductors 835, 837 can be column selection lines in a cross-point memory structure. Also by way of illustrative example, a conductive tub 27 can be laterally offset relative to the conductor 833 that is vertically adjacent the rim of such conductive tub 27, for example to control the area of the memory tunnel junction oxide region 23. As a result, a conductive tub 27 is laterally offset relative to another vertically adjacent conductive tub 27 in an adjacent layer.

The memory storage element 23 can formed of an oxide of the conductive tub 27, and the control element 25 can be formed of an oxide of the conductor 833 or 835 that is vertically adjacent the base of the conductive tub 27. Alternatively, the memory tunnel junction oxide region 23 can be formed of an oxide that is different from an oxide of the rim of the conductive tub 27, and the control tunnel junction oxide region 25 can be formed of an oxide that is different from an oxide of the conductor 833 or 835. The memory storage element 23 can also be a portion of an unpatterned oxide layer that can be a deposited oxide layer or a completely oxidized deposited metal layer, for example. Similarly, the control element 25 can be a portion of an unpatterned oxide layer that can be a deposited oxide layer or a completely oxidized deposited metal layer, for example.

Figure 7:
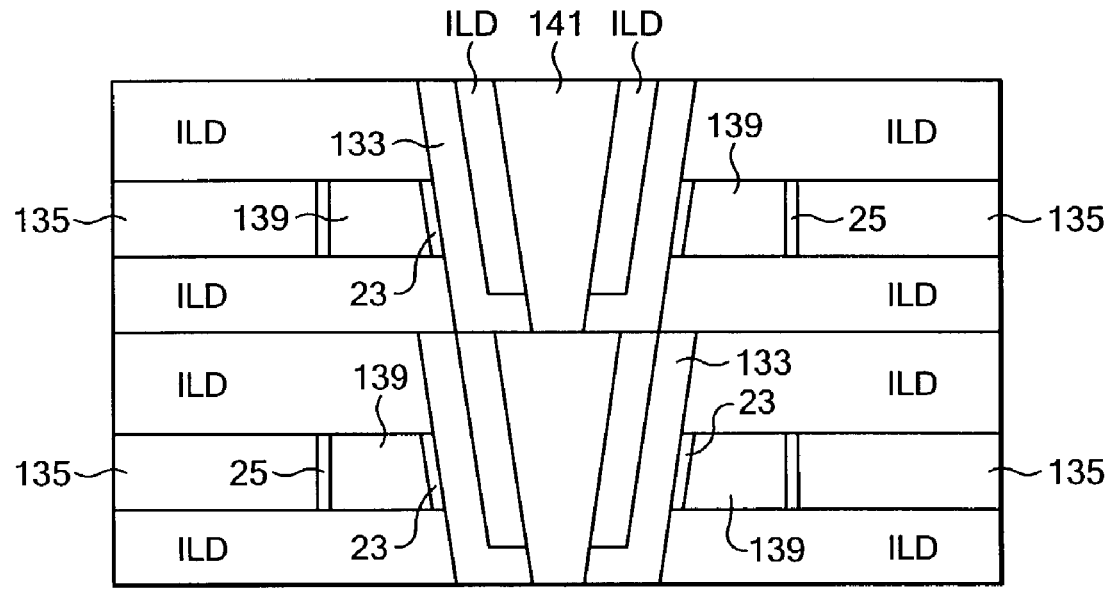
FIG. 7 is a sectional view and FIG. 8 is a plan view that schematically depict another embodiment of a memory structure that includes a memory storage element and a control element that has a cross-sectional area that is larger than a cross-sectional area of the memory storage element.
Figure 8:
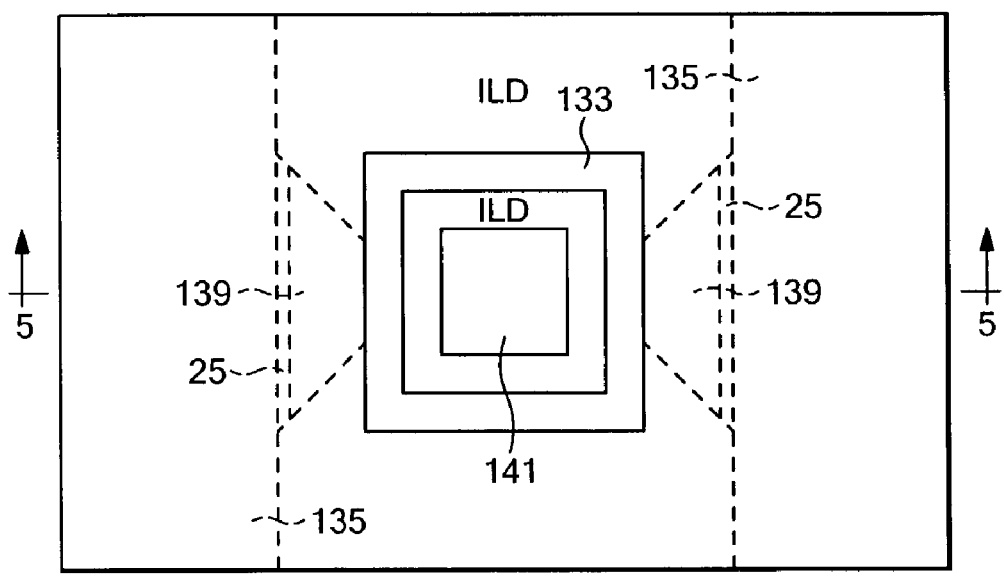

FIGS. 7 and 8 schematically depict an embodiment of a memory structure that includes memory cells each including a memory storage element 23 disposed between a conductive well or tub 133 and a conductive region or block 139 that is laterally adjacent the conductive tub 133. A control element 25 is disposed between the conductive block 139 and a conductor 135 that is laterally adjacent the conductive block 139. The memory storage element 23 and the control element 25 of a memory cell of FIGS. 5 and 6 are thus horizontally separated and each can be planar with a vertical extent. The conductive block 139 can be a truncated wedge, and the memory storage element 23 and the control element 25 are in contact with opposing faces of the truncated wedge. A vertical conductive via or pillar 141 is disposed in the conductive well 133, and can extend through an aperture in the base of the conductive tub 133. The conductive pillar 141 and the conductive tub 133 form a conductive structure having a vertical extent. The conductive tub 133 can be omitted such that the memory storage element 23 is disposed between the conductive pillar 141 and the conductive block 139.

As shown in FIGS. 7 and 8, memory cells can be formed on opposite sides of a conductive tub 133. Also, the memory cells can be formed in layers wherein a layer includes horizontally arranged conductive tubs 133 and memory cells, and wherein the layers are stacked so that corresponding conductive pillars 141 of different layers are stacked to form columns of conductive pillars 141. The columns of conductive pillars 141 can comprise vertical memory selection lines of a cubic memory structure, while the conductors 135 can comprise row memory selection lines. In a cubic memory structure, row and column memory selection lines are arranged in a 3-D structure, for example as disclosed in commonly assigned, co-pending U.S. application Ser. No. 10/116,213, filed concurrently herewith on Apr. 2, 2002, now U.S. Pat. No. 6,643,459.

The memory storage element 23 can formed of an oxide of the laterally contiguous conductive block 139 while the control element 25 can be formed of an oxide of the laterally contiguous conductor 135. Alternatively, the memory storage element 23 can be formed of an oxide that is different from an oxide of the conductive block 139, and the control element 25 can be formed of an oxide that is different from an oxide of the conductor 135. The memory storage element 23 can also be a portion of an unpatterned oxide layer that can be a deposited oxide layer or a completely oxidized deposited metal layer, for example. Similarly, the control element 25 can be a portion of an unpatterned oxide layer that can be a deposited oxide layer or a completely oxidized deposited metal layer, for example.

Figure 9:
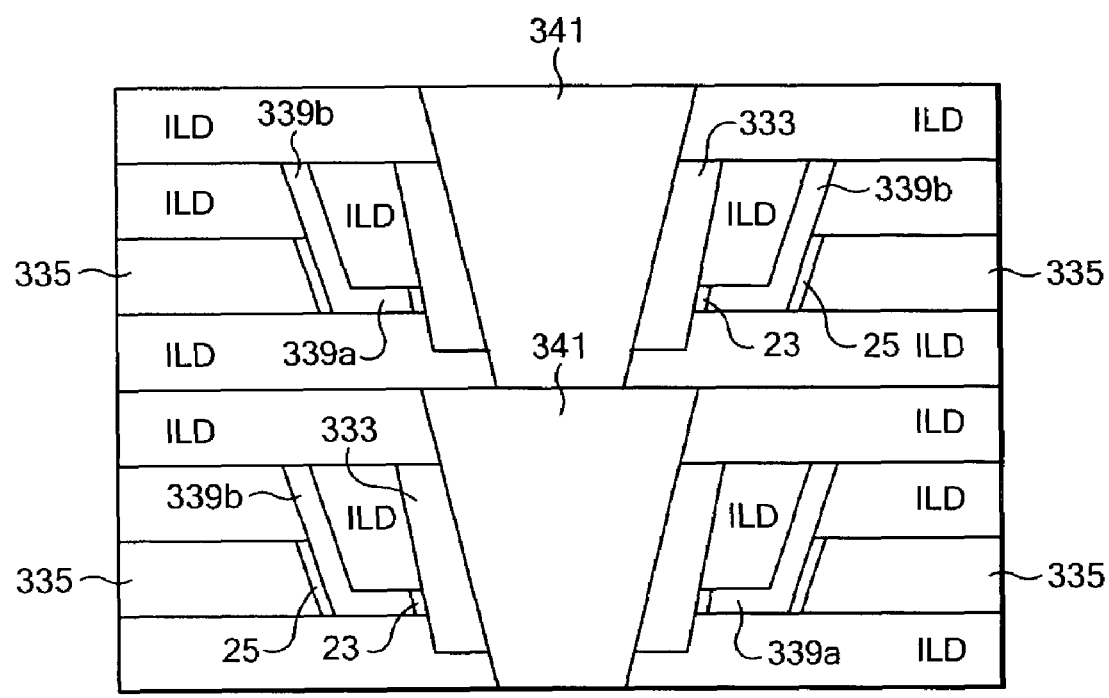
FIG. 9 is a sectional view and FIG. 10 is a plan view that schematically depict a further embodiment of a memory structure that includes a memory storage element and a control element that has a cross-sectional area that is larger than a cross-sectional area of the memory storage element.
Figure 10:
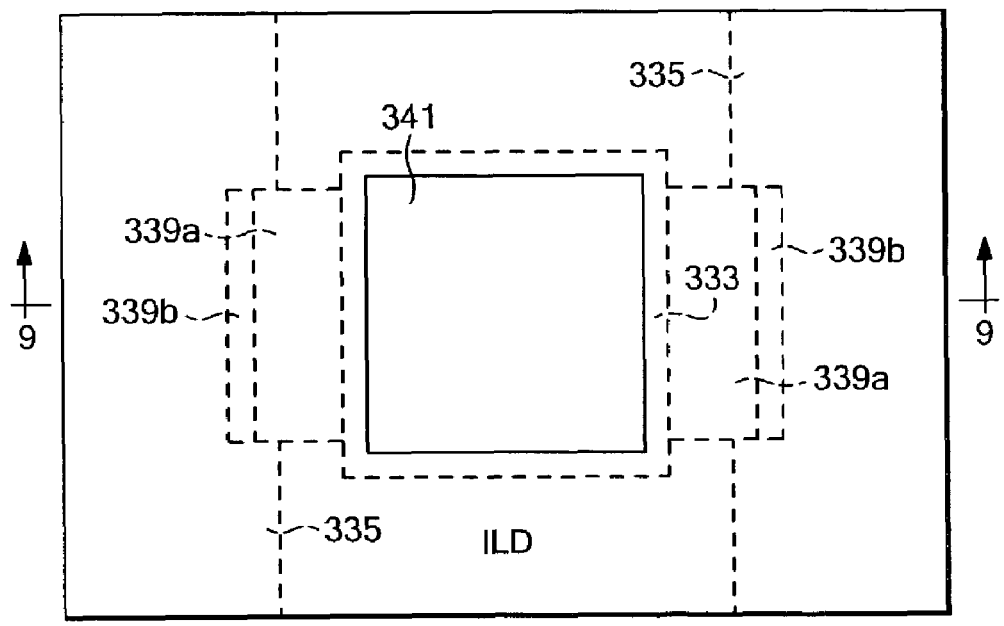

FIGS. 9 and 10 schematically depict an embodiment of a memory structure that includes memory cells each including a memory storage element 23 disposed between a conductive tub 333 and an edge of a horizontal conductive plate 339a. A non-horizontal conductive panel 339b is connected to and laterally adjacent the horizontal conductive plate 339a, and a control element 25 is disposed between a face of the non-horizontal conductive panel 339b and a conductor 335 that is laterally adjacent the non-horizontal conductive panel 339b. A vertical conductive via or pillar 341 is nested in the interior of the conductive tub 333 and passes through an aperture in the base of the conductive tub 333. The conductive pillar 341 and the conductive tub 333 form a conductive structure having a vertical extent. The conductive tub 333 can be omitted such that the memory storage element 23 is disposed between the conductive pillar 341 and the horizontal conductive plate 339a.

As shown in FIGS. 9 and 10, memory cells can be formed on opposite sides of a conductive tub 333. Also, the memory cells can be formed in layers wherein a layer includes horizontally arranged conductive pillars 341 and memory cells, and wherein the layers are stacked so that corresponding conductive pillars 341 of different layers are stacked to form columns of conductive pillars 341. The columns of conductive pillars 341 can be vertical memory selection lines of a cubic memory structure, while the conductors 335 can be row memory selection lines.

The memory storage element 23 can be formed of an oxide of the laterally contiguous horizontal plate 339a while the control element 25 can be formed of an oxide of the laterally contiguous conductor 335. Alternatively, the memory storage element 23 can be formed of an oxide that is different from an oxide of the horizontal plate 339a, and the control element 25 can be formed of an oxide that is different from an oxide of the conductor 335. The memory storage element 23 can also be a portion of an unpatterned oxide layer that can be a deposited oxide layer or a completely oxidized deposited metal layer, for example. Similarly, the control element 25 can be a portion of an unpatterned oxide layer that can be a deposited oxide layer or a completely oxidized deposited metal layer, for example.

Figure 11:
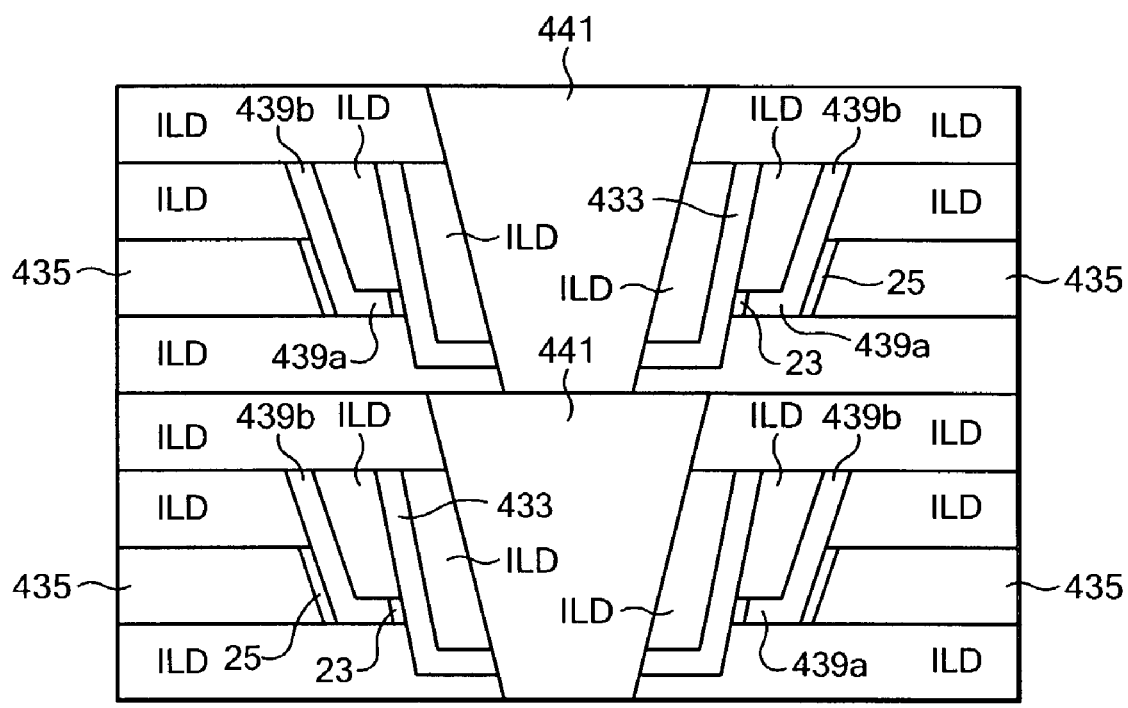
FIG. 11 is a sectional view and FIG. 12 is a plan view that schematically depict a further embodiment of a memory structure that includes a memory storage element and a control element that has a cross-sectional area that is larger than a cross-sectional area of the memory storage element.
Figure 12:
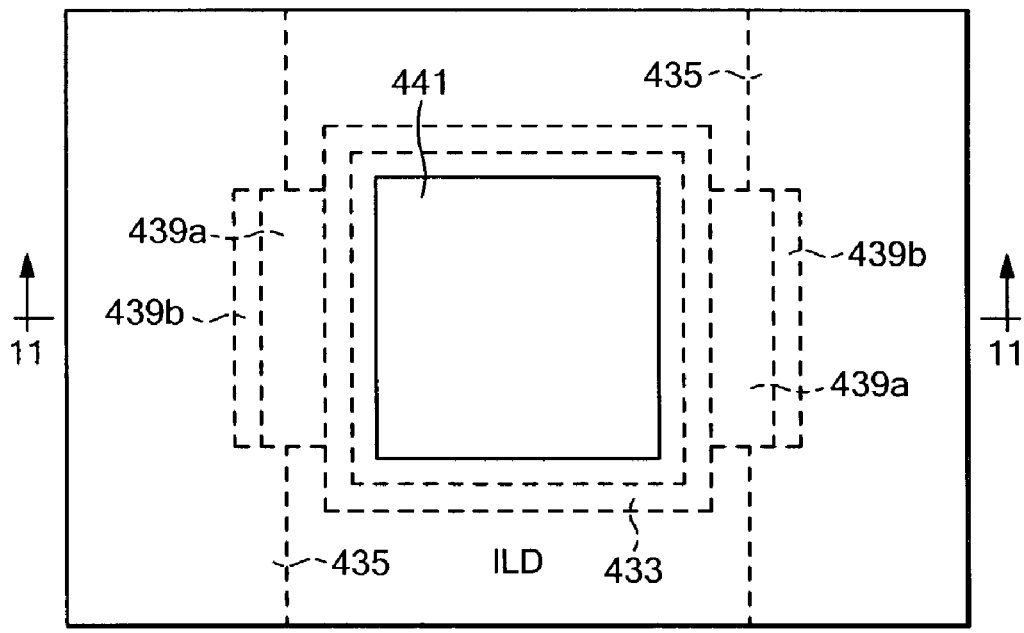

FIGS. 11 and 12 schematically depict an embodiment of a memory structure that includes memory cells each including a memory storage element 23 disposed between a conductive tub 433 and an edge of a horizontal conductive plate 439a. A non-horizontal conductive panel 439b is connected to and laterally adjacent the horizontal conductive plate 439a, and a control element 25 is disposed between a face of the non-horizontal conductive panel 439b and a conductor 435 that is laterally adjacent the non-horizontal conductive panel 439b. A conductive via or pillar 441 is nested in the interior of the conductive tub 433 and passes through an aperture in the base of the conductive tub 433. The conductive pillar 441 and the conductive tub 433 form a conductive structure having a vertical extent. The conductive tub 433 can be omitted such that the memory storage element 23 is disposed between the conductive pillar 441 and the horizontal conductive plate 439a.

As shown in FIGS. 11 and 12, memory cells can be formed on opposite sides of a conductive tub 433. Also, the memory cells can be formed in layers wherein a layer includes horizontally arranged conductive pillars 441 and memory cells, and wherein the layers are stacked so that corresponding conductive pillars 441 of different layers are stacked to form columns of conductive pillars 441. The columns of conductive pillars 441 can be vertical memory selection lines of a cubic memory structure, while the conductors 435 can be row memory selection lines.

The memory storage element 23 can be formed of an oxide of the laterally contiguous horizontal plate 439a while the control element 25 can be formed of an oxide of the laterally contiguous conductor 435. The memory storage element 23 can be formed of an oxide that is different from an oxide of the horizontal plate 439a, and the control element 25 can be formed of an oxide that is different from an oxide of the conductor 435. The memory storage element 23 can also be a portion of an unpatterned oxide layer that can be a deposited oxide layer or a completely oxidized deposited metal layer, for example. Similarly, the control element 25 can be a portion of an unpatterned oxide layer that can be a deposited oxide layer or a completely oxidized deposited metal layer, for example.

Figure 13:
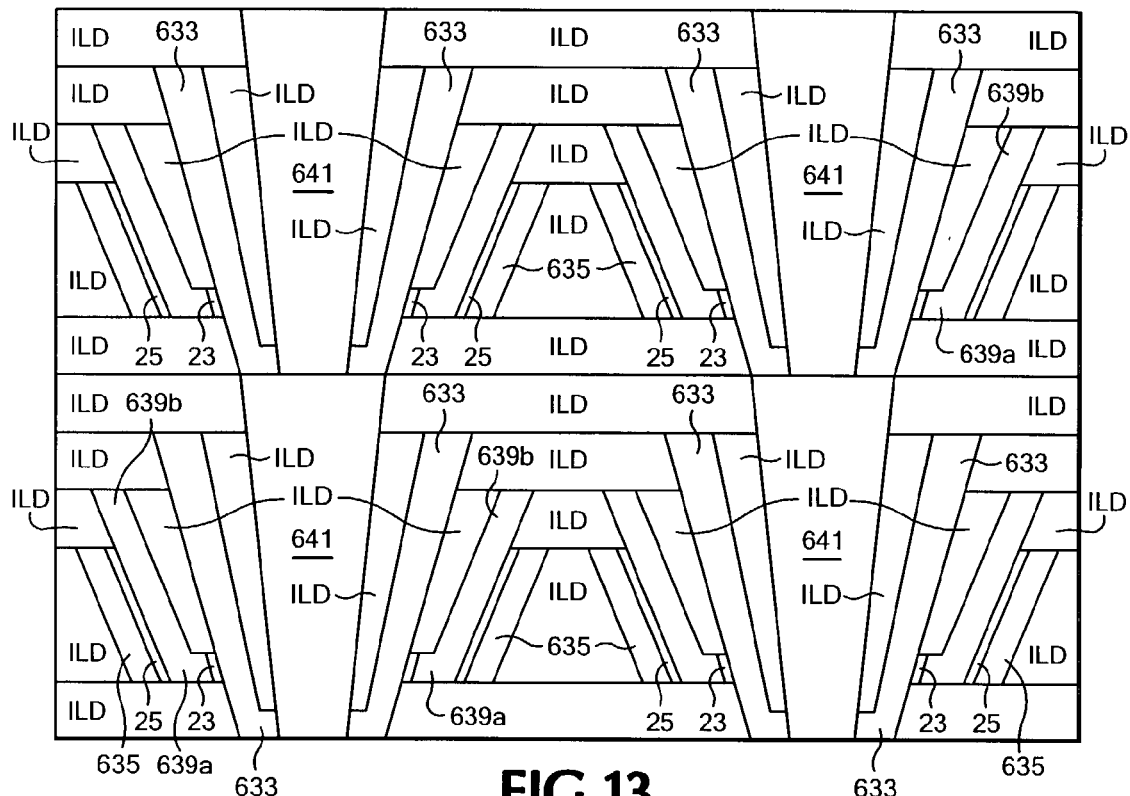
FIG. 13 is a sectional view and FIG. 14 is a plan view that schematically depict another embodiment of a memory structure that includes a memory storage element and a control element that has a cross-sectional area that is larger than a cross-sectional area of the memory storage element.
Figure 14:
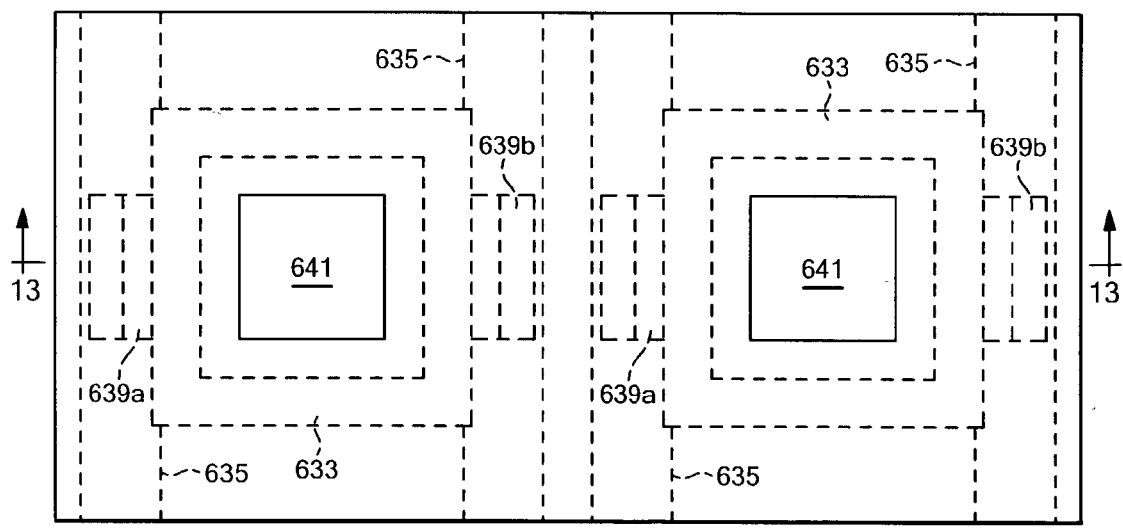

FIGS. 13 and 14 schematically depict an embodiment of a memory structure that includes memory cells each including a memory storage element 23 disposed between a conductive well or tub 633 and an edge of a horizontal conductive plate 639a. A non-horizontal conductive panel 639*b* is connected to and laterally adjacent the horizontal plate 639*a*, and a control element 25 is disposed between a face of the panel 639*b* and a face of an elongated conductive wall 635 that has a vertical extent and is laterally and laminarly adjacent the conductive panel 639*b*. A vertical conductive via or pillar 641 is disposed in the conductive tub 633 and contacts the tub at an opening in the base of the conductive tub, for example. The conductive pillar 641 and the conductive tub 633 form a conductive structure having a vertical extent. The conductive tub 633 can be omitted such that the memory storage element 23 is disposed between the conductive pillar 641 and the horizontal conductive plate 639*a*.

As shown in FIGS. 13 and 14, memory cells can be formed on opposite sides of a conductive tub 633. Also, the memory cells can be formed in layers wherein a layer includes horizontally arranged conductive tubs 633 and memory cells, and wherein the layers are stacked so that corresponding conductive pillars 641 of different layers are stacked to form columns of conductive pillars 641. The columns of conductive pillars 641 can be vertical memory selection lines of a cubic memory structure, while the elongated conductive walls 635 can be row memory selection lines.

The memory storage element 23 can be formed of an oxide of the laterally contiguous horizontal plate 639*a* while the control element 25 can be formed of an oxide of the laterally contiguous conductor 635. Alternatively, the memory storage element 23 can be formed of an oxide that is different from an oxide of the horizontal plate 639*a*, and the control element 25 can be formed of an oxide that is different from an oxide of the elongated conductive wall 635. The memory storage element 23 can also be a portion of an unpatterned oxide layer that can be a deposited oxide layer or a completely oxidized deposited metal layer, for example. Similarly, the control element 25 can be a portion of an unpatterned oxide layer that can be a deposited oxide layer or a completely oxidized deposited metal layer, for example.

Figure 15:
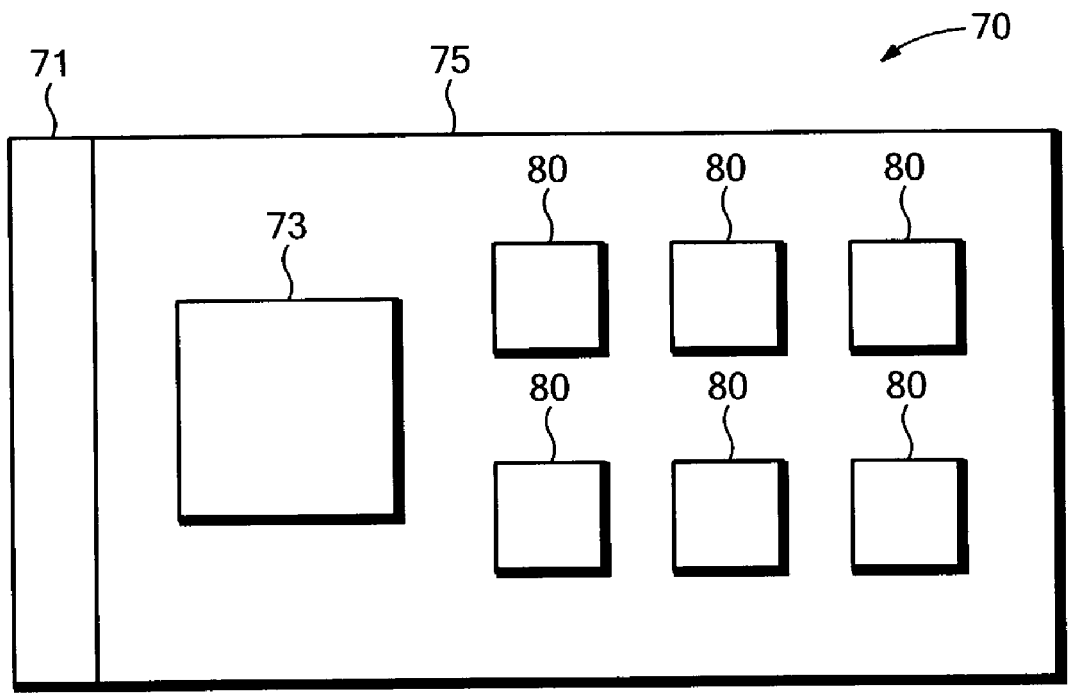
FIG. 15 is a schematic block diagram of an embodiment of a memory carrier that incorporates at least one of the disclosed memory cells.

FIG. 15 is a block diagram of a memory carrier 70 that incorporates at least one embodiment of the invention. The memory carrier represents any of standard or proprietary memory card formats such as PCMCIA, PC card, Smart memory, Memory Stick, digital film, ATA, and compact flash, to name a few. The memory carrier 70 includes a mechanical interface 71 that provides for mechanical and electrical connection with a particular connector for the type of memory carrier implemented. An optional electrical interface 73 makes electrical coupling with the electrical contacts on the mechanical connector 71 and provides for example security, address decoding, voltage translation, write protection, or other typical interface functions with a set of memory ICs 80 that incorporate at least one embodiment of the invention. A carrier 75, for example a printed circuit board or ceramic substrate, typically is used to physically support the memory ICs 80, electrical interface 73, and mechanical interface 71. It will be appreciated by those skilled in the art that some electrical devices might incorporate the functionality of the electrical interface 73, thereby obviating its need in the memory carrier 70.

Figure 16:
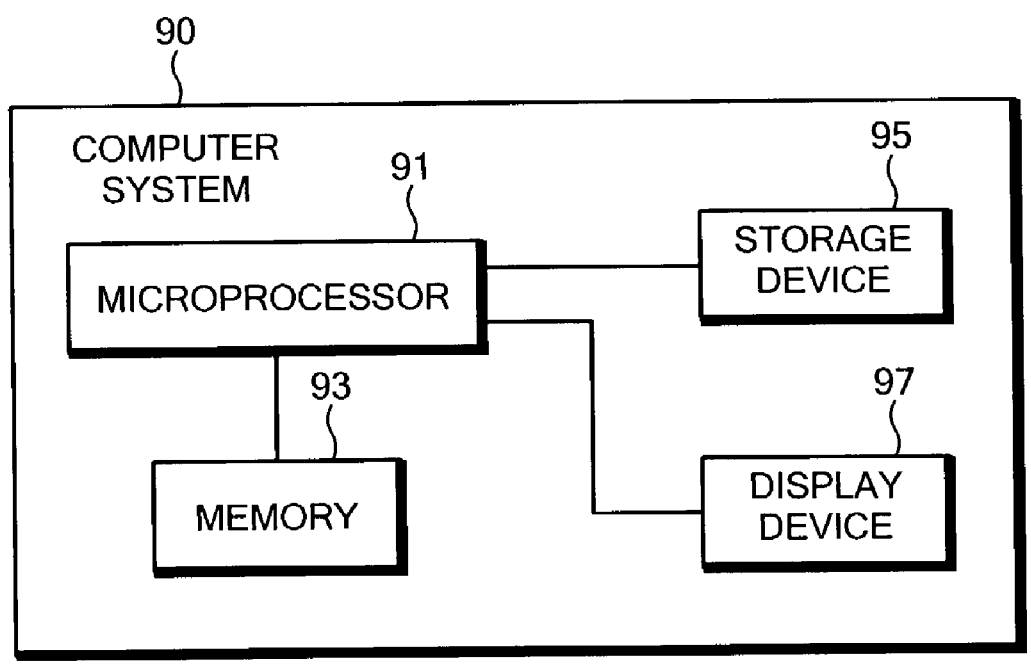
FIG. 16 is a schematic block diagram of an embodiment of an electronic device, such as a computer system, that incorporates at least one of the disclosed memory cells.

FIG. 16 is a block diagram of an electronic device, in this example a computer system 90, that incorporates at least one embodiment of the invention. In particular for a computer system, several different electrical devices as shown may be incorporated into the package. For example, a microprocessor 91 is coupled to a memory circuit 93 used to store computer executable instructions and/or user data. Exemplary memory circuits 93 include BIOS memory, random access memory (RAM), read only memory (ROM) and various levels of internal or external cache memory. The microprocessor 91 is also connected to a storage device 95 such as a hard disk drive, floppy drive, CD/DVD drive, tape drive or other mass storage devices such as those that incorporate semiconductor memory ICs that utilize the invention. The microprocessor 91 can include an internal cache memory that uses the invention. The memory 93 may also include memory ICs that use the invention. The microprocessor is further connected to a display device 97 that can also incorporate memory ICs that utilize the invention. The electronic device can also be configured to accept the memory carrier 70 of FIG. 15.

The disclosed memory structures can be implemented using semiconductor equipment. For example, the conductors can be formed by deposition of a metal layer followed by patterning by photolithographic masking and etching. Dielectric regions can be formed by deposition of dielectric material, while oxide layers can be formed by deposition of an oxide, deposition of a metal followed by oxidation of the deposited metal, or oxidation of a metal feature. Chemical mechanical polishing (CMP) can be employed to planarize and/or expose desired regions. Also, damascene processes such as dual damascene can be employed. In dual damascene processes, ILD is etched, metal is deposited on the etched ILD, and CMP is performed.

Figure 17:
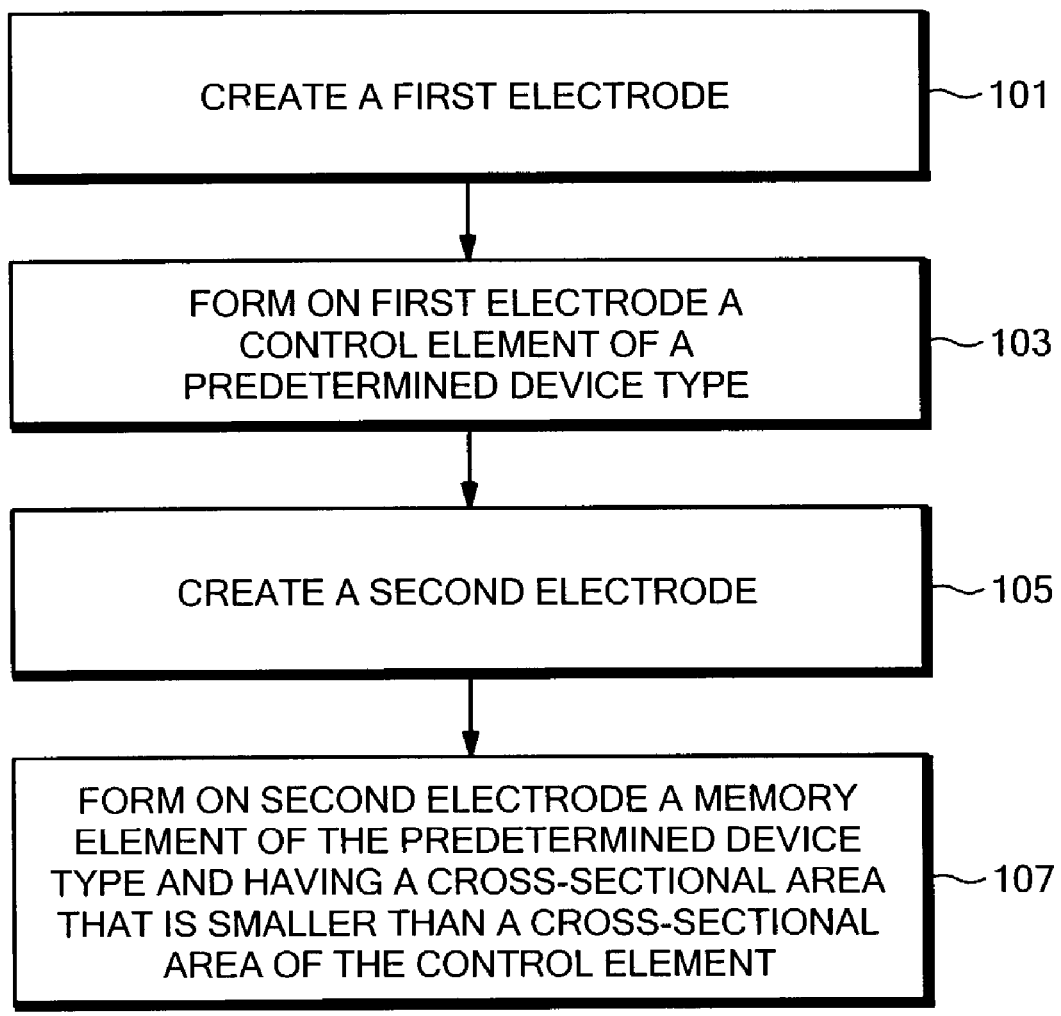
FIG. 17 is a flow diagram of an example of an embodiment of a process for making the disclosed memory structures.

Referring now to FIG. 17, the disclosed structures can generally be made as follows. At 101 a first electrode is created for example by depositing and patterning a metal layer to form the conductor 35, the conductive lines 135, or the conductors 235. At 103 a control element of a predetermined device type is formed on the first electrode, for example by oxidizing the electrode or forming an unpatterned oxide layer as described above. At 105 a second electrode is created, for example by depositing and patterning a metal layer to form an appropriate conductor. At 107 a memory storage element of the predetermined device type is formed on the second electrode, for example by oxidizing the electrode or forming an unpatterned oxide layer as described above. The memory storage element has a memory cross-sectional area that is smaller than the cross-sectional area of the control element.

Although the foregoing has been a description and illustration of specific embodiments of the invention, various modifications and changes thereto can be made by persons skilled in the art without departing from the scope and spirit of the invention as defined by the following claims.

What is claimed is:

1. A memory structure comprising:
    a first electrode;
    a second electrode having a generally vertically extending part and a generally horizontally extending part;
    a third electrode;
    a memory storage element of a predetermined device type disposed between said third electrode and said second electrode, said memory element adjacent to said vertically extending part of said second conductor or said horizontally extending part of said second electrode, but not both, and said memory storage element having a memory storage element cross-sectional area and configured for predictable breakdown as a memory storage element;
    a control element of said predetermined device type disposed between said second electrode and said first electrode, said control element adjacent to said vertically extending part of said second conductor or said horizontally extending part of said second electrode, but not both, and said control element having a control cross-sectional area and configured as a control element for said memory storage element; and said control element cross-sectional area being larger than said memory storage element cross-sectional area.

2. The memory structure of claim 1 wherein said memory element and said control element comprise tunnel junction devices.

3. The memory structure of claim 1 wherein said control element comprises an oxide of said first electrode, and wherein said memory storage element comprises an oxide of said second electrode.

4. The memory structure of claim 1 wherein said control element comprises an oxide of said first electrode, and wherein said memory storage element comprises an oxide of said third electrode.

5. The memory structure of claim 1 wherein said control element and said memory storage element are substantially co-planar.

6. The memory structure of claim 1 wherein said control element and said memory storage element are horizontally separated.

7. The memory structure of claim 1 wherein said control element and said memory storage element are vertically separated.

8. An integrated circuit including the memory structure of claim 1.

9. A memory carrier including the memory structure of claim 1.

10. An electronic device configured to receive the memory carrier of claim 9.

11. An electronic device including the memory structure of claim 1.

12. The memory structure of claim 1 wherein:
said first electrode comprises a first conductor having a top surface;
said third electrode comprises a second conductor horizontally adjacent said first conductor and having a top surface;
said control element is disposed on said top surface of said first conductor; and
said memory storage element is disposed on said top surface of said second conductor.

13. The memory structure of claim 12 wherein said first conductor and said second conductor are substantially co-planar.

14. The memory structure of claim 12 wherein said control element comprises an oxide of said first conductor, and wherein said memory storage element comprises an oxide of said second conductor.

15. The memory structure of claim 12 wherein said control element comprises an oxide different from an oxide of said first conductor.

16. The memory structure of claim 12 wherein said memory storage element comprises an oxide different from an oxide of said second conductor.

17. The memory structure of claim 1 wherein:
said second electrode comprises a conductive tub filled with dielectric material having a base and a rim that are vertically separated;
said first electrode comprises a first memory selection conductor vertically adjacent said base of said conductive tub;
said control element is disposed between said first memory selection conductor and said base of said conductive tub;

said third electrode comprises a second memory selection conductor vertically adjacent a portion of said rim of said conductive tub; and
said memory storage element is disposed between said second memory selection conductor and said rim of said conductive tub.

18. The memory structure of claim 1 wherein:
said third electrode comprises a truncated conductive cone having a rim edge;
said third electrode comprises a conductor adjacent said rim edge; and
said memory storage element is disposed between said rim edge and said conductor.

19. The memory structure of claim 1 wherein:
said third electrode comprises a conductive pillar;
said second electrode comprises a conductor laterally adjacent said conductive pillar; and
said memory storage element is disposed between said conductive pillar and said conductor.

20. The memory structure of claim 19 wherein said conductor comprises a conductive plate laterally adjacent said conductive pillar.

21. The memory structure of claim 19 wherein said conductor comprises a conductive block laterally adjacent said conductive pillar.

22. The memory structure of claim 1 wherein:
said third electrode comprises a conductive tub;
said second electrode comprises a conductor laterally adjacent said conductive tub; and
said memory storage element is disposed between said conductive tub and said conductor.

23. The memory structure of claim 22 wherein said conductor comprises a conductive plate laterally adjacent said conductive tub.

24. The memory structure of claim 22 wherein said conductor comprises a conductive block laterally adjacent said conductive tub.

25. The memory structure of claim 1 wherein:
said third electrode comprises a conductive structure having a vertical extent;
said second electrode comprises a non-horizontal conductive panel laterally adjacent said conductor and a horizontal conductive plate connected to said conductive panel;
said first electrode comprises a conductor laterally adjacent said conductive panel;
said memory storage element is disposed between an edge of said horizontal plate and said conductive structure; and
said control element is disposed between said conductor and said conductive panel.

26. The memory structure of claim 25 wherein said conductive structure comprises a conductive pillar.

27. The memory structure of claim 25 wherein said conductive structure comprises a conductive tub.

28. The memory structure of claim 25 wherein:
said conductor comprises an elongated conductive wall having a vertical extent;
said conductive panel is laminarly adjacent said elongated conductive wall; and
said control element is disposed between said conductive panel and said elongated conductive wall.

29. A memory structure comprising:
a first conductive tub having a base and a rim that are vertically separated a first memory selection conductor vertically adjacent said base of said first conductive tub;

a first control element of disposed between said first memory selection conductor and said base of said first conductive tub;

a second memory selection conductor vertically adjacent a portion of said rim of said first conductive tub;

a first memory storage element disposed between said rim of said first conductive tub and said second memory selection conductor;

said first control element having a cross-sectional area that is larger than a cross-sectional area of said first memory storage element;

a second conductive tub having a base and a rim that are vertically separated, said base being vertically adjacent said second memory selection conductor;

a second control element disposed between said second memory selection conductor and said base of said second conductive tub;

a third memory selection conductor vertically adjacent a portion of said rim of said second conductive tub;

a second memory storage element disposed between a portion of said rim of said second conductive tub and said third memory selection conductor;

said second control element having a cross-sectional area that is larger than a cross-sectional area of said second memory storage element.

30. The memory structure of claim 29 wherein said first conductive tub and said second conductive tub are horizontally offset.

31. A memory structure comprising:

a plurality of layers of memory cells;

each memory cell comprising a first electrode, a second electrode, a third electrode, a memory storage element disposed between said second electrode and said third electrode, and a control element disposed between said first electrode and said second electrode; and said control element having a cross-sectional area that is greater than a cross-sectional area of said memory storage element.

32. The memory structure of claim 31 wherein:

said second electrode comprises a conductive tub having a base and a rim that are vertically separated;

said first electrode comprises a first memory selection conductor vertically adjacent said base of said conductive tub;

said control element is disposed between said first memory selection conductor and said base of said conductive tub;

said third electrode comprises a second memory selection conductor vertically adjacent a portion of said rim of said conductive tub; and said memory storage element is disposed between said second memory selection conductor and said rim of said conductive tub.

33. The memory structure of claim 31 wherein:

said third electrode comprises a conductive pillar;

said second electrode comprises a conductor laterally adjacent said conductive pillar; and said memory storage element is disposed between said conductive pillar and said conductor.

34. The memory structure of claim 31 wherein:

said third electrode comprises a conductive tub;

said second electrode comprises a conductor laterally adjacent said conductive tub; and said memory storage element is disposed between said conductive tub and said conductor.

* * * * *